United States Patent [19]
Johnson

[11] Patent Number: 5,301,153
[45] Date of Patent: Apr. 5, 1994

[54] REDUNDANT ELEMENT SUBSTITUTION APPARATUS

[75] Inventor: Larry D. Johnson, San Jose, Calif.

[73] Assignee: MIPS Computer Systems, Inc., Sunnyvale, Calif.

[21] Appl. No.: 893,156

[22] Filed: Jun. 3, 1992

[51] Int. Cl.⁵ .............................................. G11C 7/00
[52] U.S. Cl. .............................. 365/200; 365/225.7; 365/230.06
[58] Field of Search ............... 365/200, 225.7, 230.06, 365/189.02, 230.02

[56] References Cited

U.S. PATENT DOCUMENTS

| | | | |
|---|---|---|---|
| 4,494,220 | 1/1985 | Dumbri et al. | 365/200 |
| 4,654,830 | 3/1987 | Chua et al. | 365/200 |
| 4,689,494 | 8/1987 | Chen et al. | 307/202 |
| 4,703,436 | 10/1987 | Varshney | 364/490 |
| 4,829,480 | 5/1989 | Seo | 365/200 |
| 4,829,481 | 5/1989 | Johnson et al. | 365/200 |
| 4,847,810 | 7/1989 | Tagami | 365/200 |
| 5,038,368 | 8/1991 | Lee | 365/200 |

Primary Examiner—Eugene R. LaRoche
Assistant Examiner—Huan Hoang
Attorney, Agent, or Firm—Townsend and Townsend

[57] ABSTRACT

A redundant array element or signal line is selectively added and an defective array element or signal line is eliminated by the method and apparatus of the present invention. A multiplexor receives an input signal and a neighboring input signal and outputs one of these two input signals in response to a control signal. A fuse is provided in connection with each output line and configured such that if the fuse is unblown, the device selects the same input as was selected by its upstream neighbor. If a fuse if blown, the multiplexor will select the second input and will output a control signal to its downstream neighbor causing the downstream neighbor to also output its second input line and to output a control signal to its downstream neighbor to select the second input line. The substitution of a redundant element or line is achieved by blowing a single fuse and the circuitry adds only a single mux delay to the critical path.

8 Claims, 2 Drawing Sheets

REDUNDANT ELEMENT SUBSTITUTION APPARATUS

The present invention relates to circuitry for substituting a redundant element and, in particular, for receiving a plurality of inputs, and providing output that eliminates one of the inputs and substitutes one or more of the remaining inputs.

BACKGROUND OF THE INVENTION

A number of circuits are provided with redundant elements, typically for the purpose of replacing a normally-used element which is defective. For example, a memory array may include a plurality of normally-used columns of memory cells plus one or more redundant columns. When a normally-used column is found to be defective, it is desired to discontinue use of the defective column and initiate use of a redundant column. Devices have previously been provided for substituting a redundant row or block of memory cells for a faulty row or block. However, previous devices have had certain deficiencies, particularly in the context of apparatus that must operate rapidly. U.S. Pat. No. 4,654,830 issued Mar. 31, 1987 to Chua et al. discloses a device in which the substitution involves opening a plurality of fuses in a defective row or block and also opening a plurality of fuses in the portion of the circuit which addresses the redundant row or block. There are, however, yield penalties associated with needing to open a plurality of fuses. For example, if in a typical device, a given percentage of fuses can be expected to be defective (e.g., not blowable) then the probability of being unable to substitute a redundant element is larger if a larger number of fuses needs to be opened than if a smaller number of fuses needs to be opened.

Furthermore, certain previous devices required the routing of signals over relatively long distances, such as routing a signal from a redundant element past a number of non-defective normally used elements to achieve the desired functionality.

Furthermore, some previous devices required a large number of logic gates in the data path in order to provide the desired functionality. Each logic element in the data path or critical path adds more delay to the propagating signal which cannot be tolerated in high-speed circuits.

Accordingly, it would be useful to provide a redundancy element substitution circuit which reduces or minimizes the yield penalties associated with requiring the opening of large number of fuses, the area penalties associated with routing signals over a long distance and the timing delay penalties associated with placing a large number of logic gates in the critical path.

SUMMARY OF THE INVENTION

The present invention provides a redundant element substitution circuit which receives M inputs and at least one redundant input and outputs M outputs. When none of the inputs are defective, the M inputs are passed through to the M outputs. If one of the elements, e.g. the Nth input, is defective, the apparatus is placed into a second state. In the second state inputs M through N+1 will be passed-through to outputs M through N+1. Input N will not be sent to any of the outputs. Inputs N−1 through 1 will be passed-through to outputs N through 2. The redundant input will be passed-through to output 1.

According to an embodiment of the present invention, the circuitry can be reconfigured from the first state to the second state by blowing a single fuse. Furthermore, the requirement for additional routing of signals is reduced or minimized since, according to an embodiment of the invention, it is only necessary to provide one wire from each of the M input lines to a neighboring element of the circuit. Furthermore, the signal path from the input line to the output line only needs to pass through a single multiplexor (mux) device, rather than having to pass through a large number of logic gates. In this way, the delay penalty for the propagating signal is equivalent to the delay caused by a single multiplexor.

According to one embodiment, the invention is used in a circuit having at least first and second data input lines and at least one redundant data input line. At least first and second selection circuits are provided. The first selection circuit has first and second inputs for receiving data from the first data input line and from the redundant data line and a first output for outputting data to a first output line. The second circuit has third and fourth inputs for receiving data from the second data line and from the first data line and a second output for outputting the data to the second output line. A first control line conveys a control signal from the second selection circuit to the first selection circuit. The control signal can be in a first or second state. At least the first selection circuit has a multiplexor coupled to the control line. The operation of the multiplexor is controlled by the signal on the control line. When the control signal is in a first state, the multiplexor conveys data from the first data input line to the first output line. When the control signal is in the second state, the multiplexor conveys data from the first redundant data line to the first output line. A fuse is provided in at least the second selection circuit with the fuse being configured in either a blown or an unblown state. The second selection circuit contains circuitry which operates differently depending on whether the fuse is in the unblown state or the blown state. When the fuse is in the unblown state, the circuitry conveys data from the second data input line to the second output line and also outputs the control signal in the first state. When the fuse is in the blown state, the circuitry conveys data from the first data input line to the second output line and outputs the control signal in the second state.

In one embodiment of the invention, the selection circuit is used in a memory device and the input lines are input from a plurality of column sense amps while the output lines are output to a column decoder.

The present invention also includes a method of substituting a redundant element. According to one embodiment a redundant element can be substituted by blowing only a single fuse and introducing a critical path delay equivalent to the delay produced by a single multiplexor.

DETAILED DESCRIPTION OF THE PREFERRED EMBODIMENT

Figure 1:
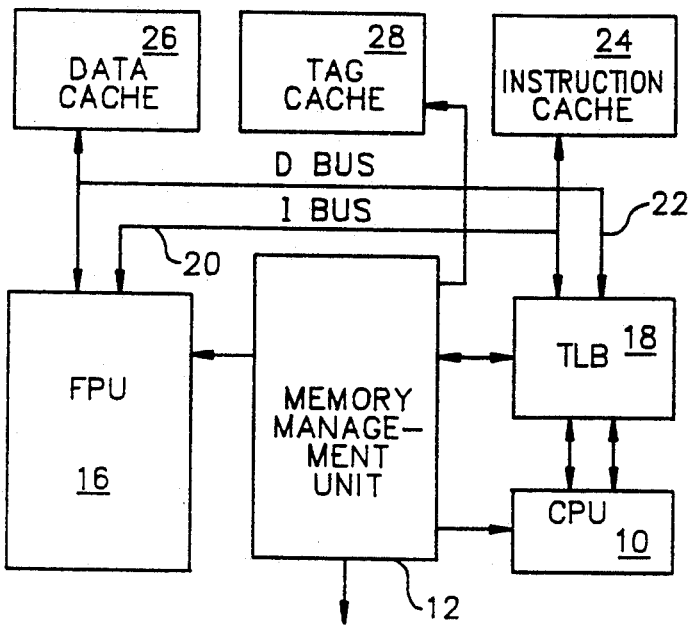
FIG. 1 is a block diagram of a microprocessor showing one potential application of the present invention.

Although the present invention can be used in connection with a number of types of memory systems, it has particular use in the context of a cache system for inclusion in a microprocessor. As depicted in FIG. 1, one embodiment of a microprocessor is build around a CPU 10 which is connected to a memory management unit 12 providing for microprocessor I/O 14 and communicates with a floating point unit 16 (FPU) and a translation lookaside buffer 18 (TLB) which also communicates directly with the CPU 10. The TLB 18 and the FPU 16 are connected by an instruction bus 20 and a data bus 22. The instruction bus 20 communicates with an instruction cache 24 and the data bus 22 communicates with a data cache 26. The memory management unit 12 communicates with a tag cache 28. The operation of all of these items are well known in the art.

The instruction cache 24, data cache 26, and tag cache 28 are specialized memory devices which have short cycle times and wide inputs and outputs. For these reasons, it is particularly important in application such as those depicted in FIG. 1 that the memories have low per bit power consumption and small drivers to minimize RC delay and current, consumption. In the instruction cache 24, data cache 26, and tag cache 28, as in other types of memory, data which is output from the memory cells on bit lines must be evaluated and output. This is typically done by a sense amplifier.

Figure 2:
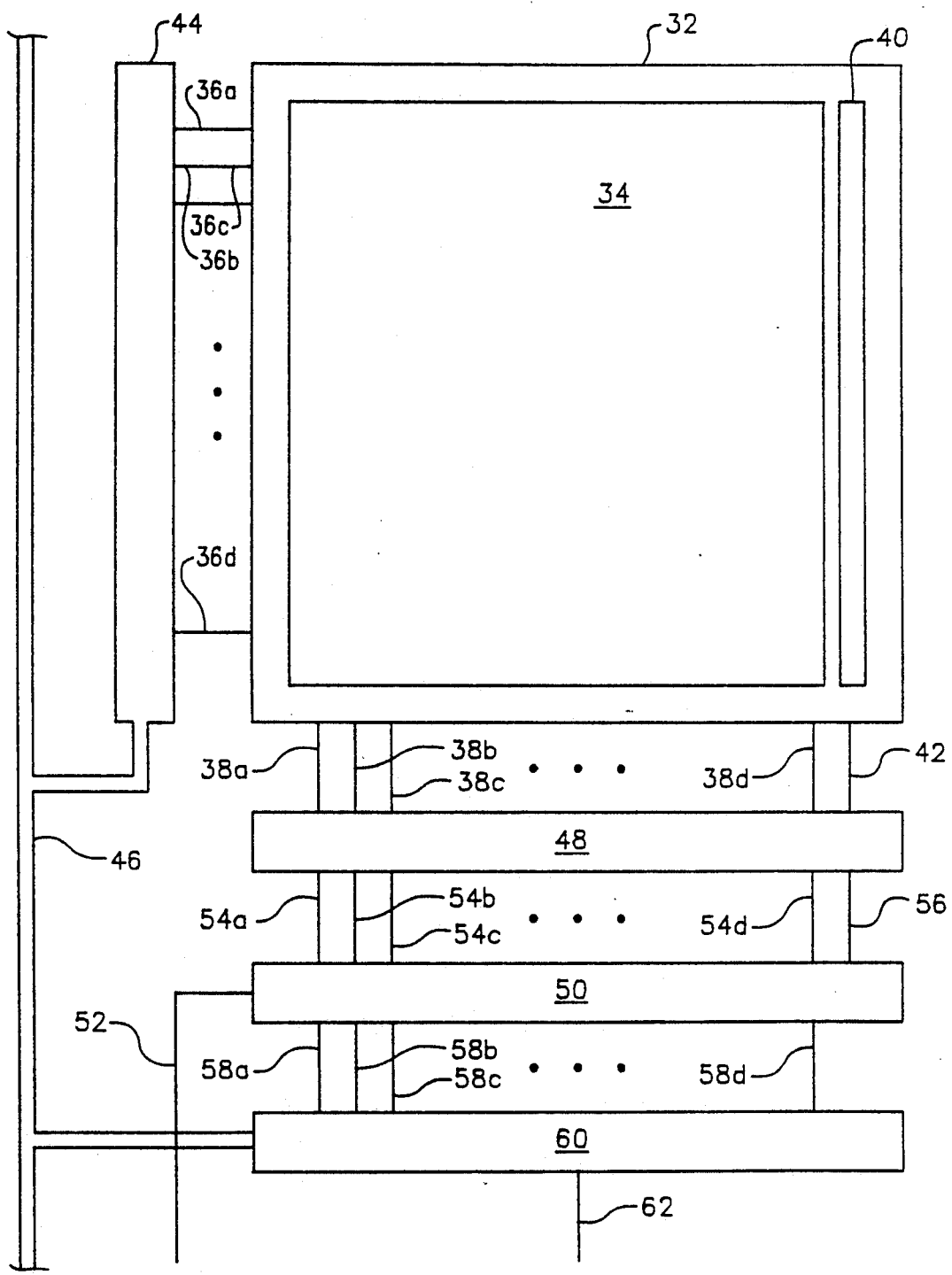
FIG. 2 is a block diagram showing an application of the present invention in the context of a memory device.

As depicted in FIG. 2, a memory array 32 includes an array 34 of normally-used memory elements (cells). In the embodiment depicted in FIG. 4, the individual memory cells in the array 34 are addressable by selecting corresponding row lines 36a through 36d and column lines 38a through 38d. A column of redundant memory cells 40 is connected to a redundant column line 42. The row lines 36a through 36d are selected using a row decoder 44 in response to an address received over an address bus 46. The binary state of an addressed cell is evaluated using sense amps 48. Selection circuitry 50 in response to a control signal provided over control line 52 selectively receives, as input, the results of the evaluation of sense amp 48 over lines 54a through 54d and 56. Lines 54a through 54d carry signals that indicate the results of the evaluation, by the sense amp 48, of signals on column lines 38a through 38d. Redundant input line 56 carries a signal that represents the result of the evaluation by the sense amp 48 of the signal on redundant column line 42.

Although only four row lines 36a through 36d and four column lines 38a through 38d are depicted in FIG. 2, typically there will be a large number of such lines. In one embodiment, there will be 256 column lines 38. Although only a single redundant column 40 and a single redundant column line 42 are depicted in FIG. 2, additional redundant elements and redundant signal lines can be provided in a manner that will be apparent to those skilled in the art after understanding the present invention.

The selection circuitry 50, in a manner to be more fully described below, receives signals over lines 54a through 54d and 56 and outputs some of these signals over output lines 58a through 58d. The signals on lines 58a through 58d are provided to a column decoder 60 which, in response to a column address received from the address bus 46, selectively provides an indication of the state of the signal on one of the lines 58a through 58d to the data output line 62.

Figure 3:
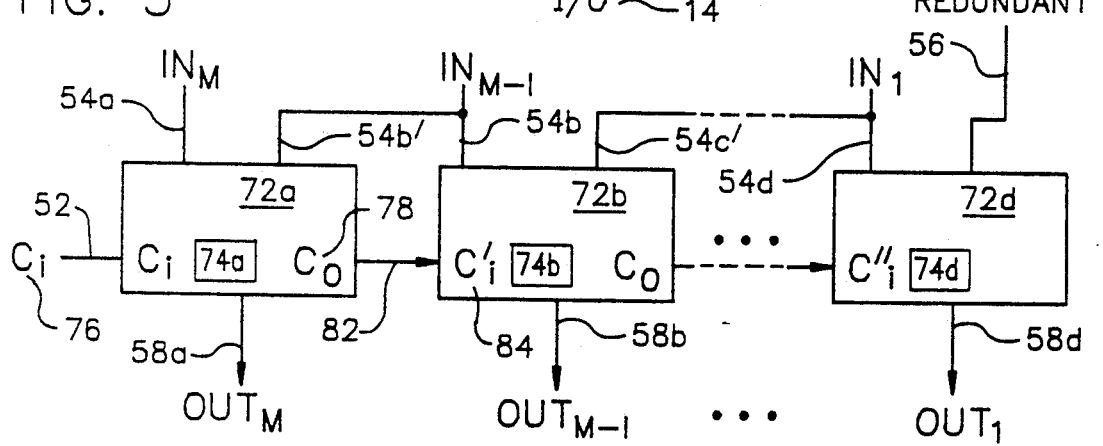
FIG. 3 is a block diagram showing a plurality of selection circuits coupled to input, output and control lines, according to one embodiment of the present invention.

According to one embodiment of the invention, the selection circuitry 50 includes a plurality of selection circuits 72a, 72b, 72c (FIG. 3). Although only three selections circuits are depicted in FIG. 3, in the preferred embodiment the number of selection circuits is equal to the number of column lines 38. For example, if there are M column lines there will be M selection circuits 72.

For purposes of description, adjacent selection circuits will be referred to as "neighboring." For example, the Kth selection circuit ($M < K < 1$) has two neighbors: the $(K+1)$th circuit and the $(K-1)$th circuit. A neighbor which is closer to a selection circuit that receives a redundant element will be called a "downstream neighbor." The downstream neighbor of the Kth selection circuit is the $(K-1)$th circuit since the first selection circuit, in this example, receives the redundant line. The other neighbor will be called the "upstream neighbor." The upstream neighbor of the Kth selection circuit is the $(K+1)$th selection circuit. The Mth selection circuit has only one neighbor and has no upstream neighbor. The first selection circuit has only one neighbor and has no downstream neighbor.

Each selection circuit 72 has a data output line, $out_1$ through $out_M$, 58a through 58d. Each selection circuit 72 has two data inputs. One data input 54 is the output from the corresponding column line 38 via the sense amp 48. For example, the selection circuit 72a which provides the Mth output 58a is connected to the Mth input 54a. The selection circuit 72d which is connected to the first output 58d is connected to the first input 54d. The second input 54' to each of the second through Mth selection circuits is the same as the first input of the downstream neighboring selection circuit. For example, the second input of the selection circuit 72a connected to the Mth output is the same as the first input of the $(M-1)$st circuit 54b. The second input of the first selection 72d is the redundant data line 56.

Each of the selection circuits 72 includes a fuse 74a through 74d. The fuse 74a through 74d can be in either a first, unblown (i.e. closed or conducting) state or a second, blown (i.e. open or nonconducting) state. The operation of the selection circuits 72 depend upon whether the corresponding fuse 74 is blown or unblown.

Each of the selection circuits 72a through 72d contains circuitry such as a multiplexor, which determines whether the output line 58 is coupled to the first input 54 or the second input 54'. In the depicted embodiment, the multiplexor is controlled by a control signal. The control signal $C_i$ 76 is received in one of the selection circuits, such as the Mth circuit 72a over a control input line 52. The selection circuit 72a outputs a control signal $C_o$ 78 over a control line 82. The output control signal 78 is based on the input control signal 76. Typically, the control signal 76 will be a binary signal. As described more fully below, in the preferred embodiment the output signal $C_o$ 78 will either be identical to the input signal $C_i$ 76 or the inverse of the input signal. The signal $C_o$ 78 which is output by the Mth selection signal is input as a control signal $C_i'$ 84 to a downstream neighboring selection circuit 72b (i.e. the same selection circuit whose first input 54b forms the second input 54b' of the selection circuit 72a which outputs the control signal 78. This relationship is repeated in each selection circuit, with the selection circuit receiving an input control signal $C_i$ and outputting a control signal $C_o$ based on the input signals $C_i$ which then forms the input signal for a neighboring selection circuit. The terminal selection circuit 72d (i.e. the selection circuit which receives the redundant input line 56 as its second input) need not output a control signal.

The control $C_i$ which is inputted into one of the selection circuits 72 determines whether the first input 54 or the second 54' will be conveyed to the output line 58, provided the fuse in that circuit is unblown. In one embodiment, depicted in FIG. 3, when the control signal $C_i$ input into the Mth selection circuit 72a is in a first state, the first input, i.e. the Mth input line 54a is used as the source of data for outputting over the Mth output line 58a, if the fuse 74a is unblown]. If the input signal $C_i$ is in a second state, the second input, i.e. the M minus first input signal line 54b' is used as the source of data for outputting over the Mth output line 58a. In the case of the first selection circuit 72d, the second input line is the redundant line 56 and thus when the control signal $C_i''$ which is input into the selection circuit 72d is in the second state, the redundant line 56 will be the source of data for the output line 58d.

When the fuse 74 is in an unblown state, there are two consequences. First, an unblown state of the fuse will result in the selection circuit 72a, in response to the control signal $C_i$ which is in the first state, to use the first input as a source for data with the output line 58, as described above. Second, the unblown state of the fuse will cause the selection circuit 72a to provide output control signal $C_o$ 78 which is configured in the state which is necessary to cause the downstream neighboring selection circuit to select the same one of the first and second inputs as selected in its control circuit. In the preferred embodiment, each of the selection circuits 72a through 72d are substantially the same and thus the control circuit which selects the first input will be the same for any of the selection circuits 72. In this situation, the unblown fuse 74 will cause the output control signal $C_o$ to have the same binary value as the input control signal $C_i$.

When the fuse 74 is in the blown state there are also two consequences. First, a fuse in the blown state causes the selection circuit 72 to use the second input 54b as the data source for the output 58 (regardless of the binary value of $C_i$ for that circuit). Second, a fuse in a blown state causes the selection circuit 72 to provide a control signal output $C_o$ 78 which causes the downstream neighboring selection circuit to select the second input as its source for data for its output line.

As an example, if the fuse 74a of the selection circuit 72a is unblown, then, in response to the input of a control signal $C_i$ in a first state, the multiplexor in selection circuit 72a selects the first input 54a as the source of data for the output line 54a and outputs an output signal $C_o$ which is identical (has the same binary value) to the input control signal $C_i$, i.e. places signal $C_o$ in the first state. If the fuse 74a is blown, the selection circuit 72a provides the second input 54b' (i.e. input data line $In_{M-1}$) as the source of data for the Mth output line 58a and also provides the output control signal $C_o$ 78 as the inverse of the input control signal $C_i$, i.e. places the output control signal $C_o$ in the second state.

Figure 4:
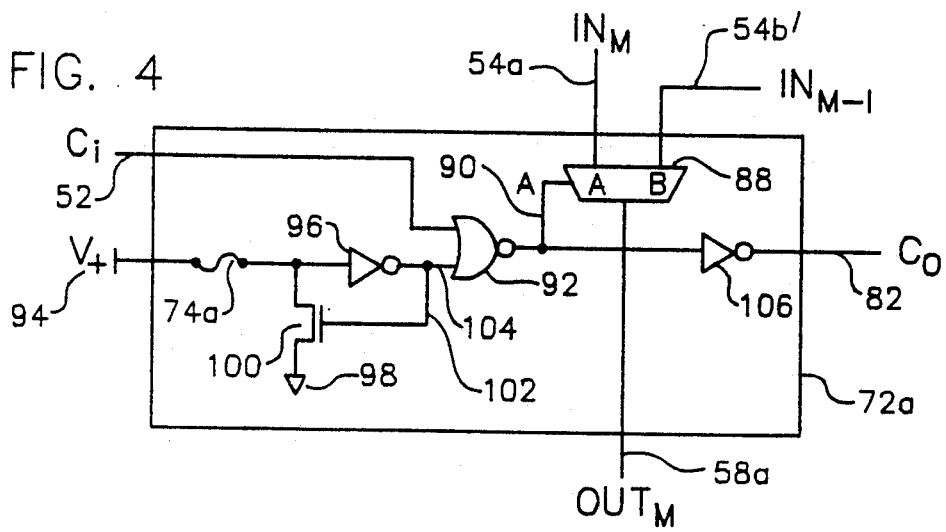
FIG. 4 depicts circuitry used in a selection of circuit according to one embodiment of the present invention.

FIG. 4 depicts circuitry which, according to one embodiment, is used for one of the selection circuits, such as circuit 72a. As shown in FIG. 4, a first input line 54a and second input line 54b' are connected to the A and B inputs of a multiplexor 88. The multiplexor is controlled by an "A" control line 90. In this embodiment, when the A control line 90 is in a logical "one" or "high" state, the multiplexor 88 forms a signal pathway between the first or "A" input 54a and the output line 58a. When the A control line 90 is in a "zero" or "low" state, the multiplexor 88 provides a signal path between the second input line 54b' and the output line 58a. The "A" control line 90 is connected to the output of a NOR gate 92. One of the inputs to the norgate 92 is the control signal 52. The other input is from circuitry which includes the fuse 74a. When the fuse 74a is in the unblown state, it provides a connection between a voltage source 94 and an invertor 96 whose output provides the second input to the NOR gate 92. The voltage source 94 is maintained at a voltage which represents a logical "one" or "high" signal. Thus, the invertor 96 provides a logical "low" signal to the NOR gate 92. As long as the second input to the NOR gate 92 is maintained in a logical low level, the output of the NOR gate 92 will be the inverse of the signal on the input line 52. In the embodiment of FIG. 4, the input control signal $C_i$ is in the first state when it has logical low or "zero" level. In this way, as long as the fuse 74 is unblown, placing a logical "low" signal on line 52 will result in a logical "high" signal being placed on the "A" control line 90 thus assuring that the multiplexor 88 will select the first input 54a as the source of the signal for the output line 58a. The line from the fuse 74a to the invertor 96 is selectively connected to ground voltage 98 by the source-drain line of the transistor 100. The gate of the transistor 100 is tied to the output of the invertor 96. Thus, when the fuse 74a is unblown, the invertor 96 outputs a logical "low" level which is supplied to the gate of the transistor 100 by line 102,, thus rendering the transistor 100 substantially nonconducting.

When the fuse 74a is blown, the invertor 96 outputs a logical "high" level since the transistor 100 causes the input to the invertor 96 to be tied to ground 98 and to, thus, be in a logical "low" state. The "high" signal output from the invertor 96 controls the gate of the transistor 100 in order to effect the connection to ground 98. Since the second input 104 to the NOR gate 92 is maintained in a logical "high" level when the fuse 74a is blown, the output of the NOR gate 92 will be a logical "low" level, no matter what logic level is input on line 52. Thus, the "A" control signal line 90 will carry a logical "low" level causing the multiplexor 88 to provide data from the second input line 54b' to the output line 58a.

The output control signal 82 will have a binary value which is the inverse of the signal output by the NOR gate 92, because of the operation of the invertor 106. Thus, when the fuse 74a is unblown and the input control signal $C_i$ 52 is low (which is the "active" state for $C_i$) NOR gate 92 will output a logical high signal and invertor 106 will output a logical low signal 82, i.e. a signal which is identical to $C_i$. When the fuse 74a is unblown and the input signal $C_i$ 52 is a logical high signal (i.e. the "inactive" state of $C_i$) the NOR gate 92 will output a logical low signal and the invertor 106 will output a logical high signal such that, again, $C_o$ is identical to the logic level of $C_i$. When the fuse 74a is blown, the output of NOR gate 92 will be a logical low level and the output of the invertor 106 will be a logical high level so that signal $C_o$ 82 will be a logical high level, regardless of the binary value of $C_i$.

In the preferred embodiment, there will be a plurality, such as 256, circuits 72a. The Mth circuit, (where M is equal to the number of output lines 58a) will receive control signal $C_i$ over line 52. All of the remaining signals will receive their control signal from the output line $C_o$ of the upstream-neighbor device 72. i.e., for $M \geq I > 1$, the output control signal $C_o$ for the Ith selection circuit forms the input control signal $C_i$ for the (I−1)th selection circuit. When none of the fuses 74 in any of the M selection circuits is blown, each selection circuit will pass the data on the Mth input line to the Mth output line. When it is desired to eliminate the Jth input line (e.g. because the data arriving on the Jth input line is defective) the fuse in the Jth selection circuit is blown (e.g. by a laser, by high-amperage current or other well known means) all of the upstream selection circuits (if any) (i.e. the M through (J+1)th selection circuits) will continue to provide signals from the first input to the output line and will continue to output a control signal $C_o$ which is identical to the input signal $C_i$. The Jth selection circuit will provide data from the second input (the (J−1)th input line) to the output, line (the Jth output line) and will output a logical "high" signal on the $C_o$ line even though it receives a logical low-signal on the input line $C_i$. Each of the downstream selection circuits (if any) (i.e. the (J−1)th through first selection circuits) will receive, as the input control signal $C_i$, a logical "high" (inactive) level (since this is the logic level output by the upstream-neighbor circuit) and will output the same logic value to its downstream neighbor, (i.e. a logical high or inactive level) because each downstream circuit receives a logical high input control signal. The multiplexor 88 of each downstream device (i.e. the (J−1)th through first selection circuit) will provide data from the second input to the output line. Thus, for the Kth selection circuit where $J > K \geq 2$, data from the K−1th input line is provided to the Kth output line. For the first output circuit, data from the redundancy input line is provided to the first output line.

These relationships are summarized in Table I. In this table, K represents the number of the selection circuits. Thus, for example, FIG. 4 shows the case where K=M. J represents the number of the data line which becomes defective. J can have any value from 1 to M, inclusive. Columns headed $C_i$ and $C_o$ have a zero to represent an input control signal which will cause the multiplexor to select the first input and a 1 to indicate the input control signal which will cause the multiplexor to select the second input. The column headed "Input Line" indicates which of the M input lines will be conveyed to the Kth output line.

TABLE I

| | Jth Fuse Unblown | | | Jth Fuse Blown | | |
|---|---|---|---|---|---|---|
| | $C_i$ | $C_o$ | Input line | $C_i$ | $C_o$ | Input line |
| $M \geq K > J$ | 0 | 0 | $In_K$ | 0 | 0 | $In_K$ |
| $K = J$ | 0 | 0 | $In_K$ | 0 | 0 | $In_{K-1}$ |
| $J > K > 1$ | 0 | 0 | $In_K$ | 1 | 1 | $In_{K-1}$ |
| $K = 1$ | 0 | 0 | $In_K$ | 1 | 1 | Redundant |

As can be seen from FIG. 4, the circuitry which the present invention adds to the critical path (i.e. adds to the path between the input line 54 and the output lines 58) is a single multiplexor 88. Thus, the present invention provides a delay penalty for the propagating signal of only one mux (i.e. a delay equal to the delay produced in a signal going from the multiplexor input to the multiplexor output).

In light of the above description, a number of advantages of the present invention can been seen. The present invention permits removal of defective elements or signals from an array of elements or signals and insertion of a functional element. The present invention reduces or minimizes the number of fuses to provide the above functionality in response to blowing only a single fuse. The present invention reduces or minimizes the routing of signals so that the above-described result is achieved using a routing which involves only a single wire 54b' from one signal line or element to a neighboring element. The present invention reduces or minimizes the delay penalty for a propagating signal to one mux delay.

A number of variations or modifications of the present invention could also be used. The present invention can be used to substitute two or more redundant elements, by a system which involves blowing no more than two fuses and having no more than two mux delays. For example, the output from a shift circuit 50 could be used as the input to another, substantially identical shift circuit. Alternatively, each selection could have a three-to-one multiplexor, controlled by two control lines and two fuses for controlling the output control signals and/or multiplexors. Although the invention was described in terms of data lines which can be output lines from memory column sense amps, the present invention can be used in connection with other types of lines such as address lines or control lines and with other types of device. For example, the present invention could be used in connection with a shifter. A shifter could have a redundant element connected such that by blowing the fuse, the shift data bypasses one of the shifter elements and goes to the next element. The present invention could be used in connection with registers in which information is being registered from one bit to the next bit. Although the above description shows an embodiment in which each of the selection circuits is identical, it is possible to provide a circuit in which the selection circuits are not all identical (e.g., every other selection circuit might be active-high rather than active-low). Although the present invention was described having a control signal which selects a first multiplexor input when in the "low" logical state, the present invention could be designed to select the first input line in response to a logical "high" signal. Although the present invention is described in terms of including a NOR gate, other logic gates can also be used to achieve the desired functionality, as is well known in the art.

Although the present invention has been described by way of preferred embodiment and various modifications and variations, other modifications and variations can also be used, the invention being defined by the following claims.

What is claimed is:

1. In a circuit having at least first and second data input lines and at least a first redundant data input line, apparatus for receiving data from said first and second data input lines and said redundant data input line and selectively outputting data, on at least first and second output lines, the apparatus comprising:

at least first and second selection circuits, the first selection circuit having first and second inputs for receiving data from said first data input line and from said first redundant data input line, respectively, and a first output for outputting data to said first output line, said second selection circuit having third and fourth inputs for receiving data from said second data input line and said first data input line, respectively, and a second output for outputting data to said second data input line;

a first control line for conveying a first control signal from said second selection circuit to said first selection circuit, said first control signal being in a first or second state;

said first selection circuit having a multiplexor, coupled to said first control line and said first and second inputs, to covey data from said first data input line to said first output line when said first control signal is in said first state and to convey data from said first redundant data line to said first output line when said first control signal is in said second state;

a fuse in said second selection circuit which can be in a blown or an unblown state, and means in said second selection circuit for conveying data from said second data input line to said second output line, and for outputting said first control signal in said first state on said first control line when said fuse is in said unblown state and conveying data from said first data input line to said second output line and for outputting said first control signal in said second state on said first control line when said fuse is in said blown state.

2. Apparatus, as claimed in claim 1, wherein said second selection circuit includes a multiplexor and further comprising at least a third selection circuit having a fuse and having means for conveying data from a third data input line to a third output line and for outputting a control signal for controlling said multiplexor of said second selection circuit when said fuse is in an unblown state and for conveying data from said second data input line to said third output line and for outputting said second control signal in said second state when said fuse is in said blown state.

3. Apparatus, as claimed in claim 1, comprising at least 256 selection circuits substantially identical to said second selection circuit, coupled together by a plurality of control lines.

4. In a circuit having at least first and second data input lines and at least a first redundant data input line, apparatus for receiving data from said first and second data input lines and said redundant data input line and selectively outputting data, on at least first and second output lines, the apparatus comprising:

at least first and second selection circuits, the first selection circuit having a multiplexor for receiving data from said first data input line and from said first redundant data input line, respectively, under control of a first control signal, and having a first output for outputting data to said first output line, said second circuit having a second multiplexor for receiving third and fourth inputs from said second data input line and said first data input line, respectively, and under control of a second control signal, outputting data to said second data input line;

a first control line for conveying said first control signal from said second selection circuit to said first selection circuit, said first control signal being in a first or second state;

a second control line for receiving a second control signal in said second selection circuit, said second control signal being in a first or second state;

said first selection circuit having said first multiplexor configured to convey data from said first data input line to said first output line when said first control signal is in said first state and to convey data from said first redundant data input line to said first output line when said first control signal is in said second state;

a fuse in said second selection circuit which can be in a blown or unblow state, and logic circuitry in said second selection circuit for conveying data from said second data input line to said second output line and for outputting a control signal on said first control line substantially identical to the control signal received on said second control line when said fuse is in said unblown state and for conveying data from said first data input line to said second output line and outputting a control signal on said first control line which is the inverse of said control signal received on said second control line, when said fuse is in said blown state.

5. In a circuit having at least first and second data input lines and at least a first redundant data input line, a method for receiving data from said first and second data input lines and said redundant data input line and selectively outputting data, on at least first and second output lines, the method comprising:

providing at least first and second selection circuits, configurable in a first state or second state;

configuring said selection circuits in said first state wherein data on said first data line is provided to said first output line and wherein data from said second data input line is provided to said second output line; and reconfiguring said selection circuits to a second configuration by blowing no more than a single fuse wherein data from said redundant data input line is provided to said first output line and data from said first data input line is provided to said second output line.

6. A method, as claimed in claim 5, wherein said step of reconfiguring includes routing data along a path with an increased path length which does not substantially exceed the distance from said first data line to said second selection circuit for one of said selection circuits.

7. A method, as claimed in claim 1, further comprising delaying the signal between said input lines and said output lines by an amount equal to about 1 mux delay.

8. In a circuit having at least first and second data input lines and at least a first redundant data input line, apparatus for receiving data from said first and second data input lines, and said redundant data input line, and selectively outputting data, on at least first and second output lines, the apparatus comprising:

at least a first selection circuit having a multiplexor for receiving two inputs and providing a single output under control of a control signal provided over a first control line;

said first invertor having its input connected, by a blowable fuse, to a voltage source;

said input of said invertor connected, by a transistor, to a ground voltage source;

the gate of said transistor connected to the output of said invertor;

a NOR gate with first and second inputs and a single output, said output connected to said first control line, said first NOR gate input connected to an input control line, said second NOR gate input connected to the output of a first invertor;

the output of said NOR gate connected to the input of a second invertor; and the output of said second invertor provided to an output control signal line.

* * * * *